United States Patent [19]

Iwamura et al.

[11] Patent Number: 5,753,886
[45] Date of Patent: May 19, 1998

[54] PLASMA TREATMENT APPARATUS AND METHOD

[75] Inventors: Naoyuki Iwamura; Yasutsugu Aoki, both of Suwa, Japan

[73] Assignee: Seiko Epson Corporation, Tokyo, Japan

[21] Appl. No.: 598,082

[22] Filed: Feb. 7, 1996

[30] Foreign Application Priority Data

Feb. 7, 1995 [JP] Japan .................. 7-019191
Dec. 5, 1995 [JP] Japan .................. 7-344404

[51] Int. Cl.[6] .................................................. B23K 10/00
[52] U.S. Cl. .................................. 219/121.43; 219/121.44; 219/121.51; 156/345; 156/646.1
[58] Field of Search ........................ 219/121.43, 121.36, 219/121.4, 121.59, 121.52, 121.51; 156/345, 643.1; 204/298.34, 298.06, 192.1, 298.37, 298.16, 298.38

[56] References Cited

U.S. PATENT DOCUMENTS

| | | | |
|---|---|---|---|
| 3,762,941 | 10/1973 | Hou | 117/93.1 |
| 4,012,307 | 3/1977 | Phillips | 204/192 |
| 4,430,547 | 2/1984 | Yoneda et al. | 219/121 |
| 4,705,593 | 11/1987 | Haigh et al. | 156/635 |
| 4,708,766 | 11/1987 | Hynecek | 156/643 |
| 4,749,440 | 6/1988 | Blackwood et al. | 156/646 |
| 4,857,382 | 8/1989 | Liu et al. | 428/156 |
| 4,921,157 | 5/1990 | Dishon et al. | 228/124 |
| 5,000,819 | 3/1991 | Pedder et al. | 156/643 |
| 5,045,166 | 9/1991 | Bobbio | 204/192 |
| 5,120,568 | 6/1992 | Schuurmans et al. | 427/37 |
| 5,126,164 | 6/1992 | Okazaki et al. | 427/39 |
| 5,147,520 | 9/1992 | Bobbio | 204/192 |
| 5,178,682 | 1/1993 | Tsukamoto et al. | 118/722 |
| 5,201,995 | 4/1993 | Reisman et al. | 156/646 |
| 5,225,659 | 7/1993 | Kusano et al. | 249/121 |
| 5,240,559 | 8/1993 | Ishida | 456/666 |
| 5,290,378 | 3/1994 | Kusano et al. | 156/272 |
| 5,292,370 | 3/1994 | Tsai et al. | 156/345 |
| 5,316,739 | 5/1994 | Yoshikawa et al. | 422/186 |
| 5,340,618 | 8/1994 | Tanisaki et al. | 427/488 |
| 5,368,685 | 11/1994 | Kumihashi et al. | 156/643.1 |
| 5,384,167 | 1/1995 | Nishiwaki et al. | 427/569 |
| 5,391,855 | 2/1995 | Tanisaki | 219/121.43 |
| 5,399,830 | 3/1995 | Maruyama | 219/121.43 |
| 5,407,121 | 4/1995 | Koopman et al. | 228/206 |
| 5,449,432 | 9/1995 | Hanawa | 156/643.1 |
| 5,499,754 | 3/1996 | Bobbio et al. | 228/42 |
| 5,597,438 | 1/1997 | Grewal et al. | 156/345 |

FOREIGN PATENT DOCUMENTS

| | | |
|---|---|---|
| 371693 | 6/1990 | European Pat. Off. . |
| 59-158525 | 9/1984 | Japan . |
| 60-1861 | 1/1985 | Japan . |
| 61-127866 | 6/1986 | Japan . |
| 1-125829 | 5/1989 | Japan . |
| 2-190489 | 7/1990 | Japan . |
| 2-281734 | 11/1990 | Japan . |
| 3-174972 | 7/1991 | Japan . |
| 3-219082 | 9/1991 | Japan . |
| 3-236475 | 10/1991 | Japan . |
| 4-186619 | 7/1992 | Japan . |
| 5-82478 | 4/1993 | Japan . |
| 6-2149 | 1/1994 | Japan . |
| 6-190269 | 7/1994 | Japan . |

*Primary Examiner*—Mark H. Paschall
*Attorney, Agent, or Firm*—Stroock & Stroock & Lavan LLP

[57] ABSTRACT

A plasma treatment and apparatus which enables improved uniform plasma treatment over the entire surface of an object to be treated, improved yield, and higher treatment speed is provided. In a gas introduction passage, the gas capable of plasma discharge is preexcited to raise its level of excitation. A first pair of plasma generation electrodes downstream along the gas flow passage use the preexcited gas to generate a plasma in a first plasma generation position. Further downstream, a second pair of plasma generation electrodes positioned in a second plasma generation position, where the activated state of the gas activated in the first plasma region is maintained, activates the gas to generate a plasma containing activated gas species. The object to be treated is treated by the activated gas species in the second plasma region.

37 Claims, 9 Drawing Sheets

PLASMA TREATMENT APPARATUS AND METHOD

BACKGROUND OF THE INVENTION

1. Field of the Invention

The present invention relates generally to a plasma treatment apparatus and method which can treat an object with activated gas species formed by a plasma. In particular, the present invention relates to a plasma treatment apparatus and method which can treat an object by generating a plasma at a plurality of positions along the flow path of a gas capable of plasma discharge, and by forming activated gas species by the plasma generated in the most downstream position and applying the activated gas species to the object. The invention further relates to a plasma treatment apparatus and method which includes preexciting the gas capable of plasma discharge upstream from the first plasma generation position along the flow path of the gas, and treating the object to be treated by means of activated gas species in the plasma formed in the most downstream plasma generating position.

2. Description of Prior Art

There are two forms of plasma treatment apparatus, known as vacuum plasma treatment apparatus and atmospheric pressure plasma treatment apparatus. Examples of the atmospheric pressure plasma treatment apparatus are disclosed in, for example Japanese Patent Application Laid-Open No. 1-125829 and Japanese Patent Application Laid-Open No. 6-190269. The atmospheric pressure plasma treatment apparatus applies a high frequency voltage to form a discharge in a gas at atmospheric pressure to generate a plasma. The plasma forms activated gas species which are then applied to the object to be treated to carry out an ashing or etching process.

More specifically, in this method a high-frequency voltage is applied to a gas capable of plasma discharge being supplied from a gas supply to generate the plasma by activating the gas forming activated species. Then the activated gas species react with either the object to be treated or with a film formed on the surface thereof, and the reaction products are removed by vaporization.

Since an atmospheric pressure plasma treatment apparatus allows the treatment to be carried out at atmospheric pressure, the construction of the apparatus can be simplified, and handling made easy. There are the additional advantages that the treatment can be carried out rapidly and at low cost.

On the other hand, in a conventional atmospheric pressure plasma treatment apparatus, since the plasma is generated at atmospheric pressure, the uniformity and stability of the plasma is not always adequate. As a result, problems occur, including non-uniformities in the treatment or the existence of untreated portions of the object to be treated. The further drawback with this type of atmospheric pressure plasma treatment apparatus has been pointed out that, in general, the ashing rate or etching rate is low.

These problems are most severe in the case of an atmospheric pressure plasma treatment apparatus, but similarly a vacuum plasma treatment apparatus typically also requires improvement in the treatment rate.

SUMMARY OF THE INVENTION

In view of the above problems the present invention provides a plasma treatment apparatus and method which generates a stable plasma and is able to improve the treatment rate and yield from the treatment.

Generally speaking, in accordance with the invention, a plasma treatment apparatus for treating a surface of an object to be treated is provided. The plasma treatment apparatus includes a treatment chamber in which the object to be treated is disposed. A gas supply is in fluid communication with the treatment chamber and supplies a gas capable of plasma discharged to the chamber. A plurality of plasma generation units for activating the gas to generate a plasma are provided at different locations along the flow path of the gas through the gas supply. The plasma generation unit downstream along the flow path of the gas supply activates the gas to generate activated gas species in a gas that has been preactivated by the plasma generation unit upstream along the flow path of the gas supply. The plasma generation unit downstream can also serve to maintain the activated state of the gas generated by the plasma generation unit upstream.

The present invention also provides a method of plasma treating a surface of an object to be treated, including the steps of supplying a gas capable of plasma discharge through a gas supply and towards an object to be treated disposed in a treatment chamber. A plasma is then generated in the gas at different locations along the flow path of the gas through the gas supply. The plasma generated at a downstream position can maintain the activated state of the gas generated by a plasma generation at the upstream position. The plasma generated upstream can be a preactivated state plasm. The object to be treated is treated by the activated gas species from the downstream plasma generation position along the flow path of the gas supply.

According to the present plasma treatment apparatus and method, the gas can be activated downstream from the upstream plasma preactivation position before the complete preactivated state of the gas is lost. In other words, the gas reaching the downstream plasma generation position maintains the ionized or near-ionized state, formed by preactivation, i.e., the gas is not yet fully ionized, but its excitation level is high, due to the upstream plasma preactivation. Thus, the generation of a plasma and formulation of activated gas species in the downstream region is made easier and more uniform and stable.

By treating the object to be treated with activated gas species formed by the plasma, the yield of the treatment is improved. Again, since the uniformity of the downstream plasma density is improved, the uniform surface treating of the object to be treated is also improved. Furthermore, since the density and excitation level of the activated gas species in the downstream plasma region are increased, the ashing rate, etching rate and other treatment rate can also be improved.

Another aspect of the present invention provides a plasma treatment apparatus for treating a surface of an object to be treated which includes a treatment chamber in which the object to be treated is disposed. A gas supply for supplying a gas capable of discharge is in fluid communication with the treatment chamber. A first plasma generation unit for pre-activating the gas to generate a plasma is positioned upstream along the flow path of the gas in the gas supply; and a second plasma generation unit for activating the gas to generate a plasma downstream along the flow path of the gas in the gas supply is also provided. Thus, the first plasma generation unit preactivates the gas and the second plasma generation unit activates the gas and forms activated gas species. Then, the activated gas species formed by the second plasma generation unit treat the object to be treated.

Furthermore, in accordance with this invention, the first plasma generation unit may include a first pair of electrodes and a first alternating current power source connected across the first pair of electrodes, while the second plasma generation unit may comprise a second pair of electrodes and a second alternating current power source connected across the second pair of electrodes. In this case it is preferable that the frequency of the first alternating current power source be lower than that of the second alternating current power source.

The higher the frequency of the second alternating current power source used to generate the plasma close to the object to be treated (i.e., downstream along the gas supply), the lower is the degree of plasma damage suffered by the object to be treated. The reason for this is hypothesized as follows. The plasma damage suffered by the object to be treated depends on the magnitude of the energy imparted to electrons and ions of the activated gas species in the plasma, and on the number of electrons and ions reaching the object to be treated, that is, on the degree of movement of the electrons and ions. In other words, the larger the electron or ion energy imparted to the electrons and ions, and the higher the degree of movement of the electrons and ions, the larger is the plasma damage. Furthermore, increasing the frequency reduces the electrostatic capacitance impedance ($\omega_c = 1/2\pi f_c$) between the electrodes and the gas, allowing an adequate current to be supplied through the gas. This therefore increases the energy imparted to the electrons and ions, which in itself tends to increase the plasma damage.

On the other hand, when the frequency is increased, it is more difficult for the electrons and ions to move in step with the frequency, and in particular the ability of the heavier ions to move in step is much more sharply reduced than that of the electrons. For this reason the total number of electrons and ions reaching the object to be treated is reduced. This latter reason appears to be overriding, and as a result, the charge voltage occurring on the object to be treated is reduced, and the charge damage to the object to be treated is reduced. Therefore, the yield of the treatment on the object to be treated is thus improved by using a higher frequency in the downstream plasma generation unit.

On the other hand, lowering the frequency of the first alternating current power source used to generate the plasma further removed from the object to be treated, (i.e., the plasma generation unit upstream along the gas supply flow path) increases the alternating peak-to-peak voltage, allowing the gas to be adequately activated. As a result, the generation of the plasma downstream becomes easier, and the density and excitation levels of the activated gas species in the downstream plasma can be increased.

In order to reduce the plasma damage in this way, in general the frequency of the second alternating power may be set to be higher than the conventional commercial frequency of 13.56 MHZ. In experiments it was confirmed that using a frequency of 40.68 MHZ produced less damage than a frequency of 13.56 MHZ. On the other hand, the frequency of the first alternating power is preferably in the range of about 400 kHz to about 13.56 MHZ. The upper limit for this frequency, that is, 13.56 MHZ, has already been established as the frequency for generating a plasma, and if the frequency is below the lower limit of about 400 kHz, an abnormal discharge tends to occur.

It is also preferable that the first alternating current power source has a greater voltage than the second alternating current power source. This allows the gas to be adequately activated in the upstream plasma region, and ensures the stability of the plasma even in the lower-powered downstream plasma region. Moreover, since less power is used for generating the downstream plasma which is used for treating the object to be treated, the plasma damage suffered by the object to be treated can be reduced.

In the case where the gas supply has a gas flow path with a cross-sectional area smaller than the cross-sectional area of the treatment chamber, it is preferable that the first pair of electrodes in the upstream plasma discharge unit be disposed opposite each other with the gas flow path therebetween. Thus, the gap between the pair of electrodes in the upstream plasma discharge unit can be made small, the plasma density in the upstream plasma region increased, and the gas adequately activated.

Alternatively, the pair of electrodes disposed in the upstream plasma generation unit may be disposed within the treatment chamber. In this case the first pair of electrodes may be parallel to the treatment surface of the object to be treated. With this arrangement, each of the first pair of electrodes should have holes formed therethrough for allowing the gas to flow, and may be made of, for example, a porous metal sheet.

Of the first pair of electrodes disposed upstream, the electrode closer to the object to be treated should be grounded. In this case, charged particles such as electrons and ions in the plasma can be captured by the grounded electrode. As a result, since only neutral activated gas species are directed toward the object to be treated, it is possible to prevent charging and damage to the object to be treated caused by exposure to ions.

The second pair of electrodes, that is, the electrodes disposed in the downstream plasma discharge unit, may comprise a mounting electrode on which is mounted the object to be treated, and an opposite electrode disposed opposite the mounting electrode with the object to be treated therebetween. With this arrangement, the opposite electrode should have holes formed therethrough for allowing the gas to flow, and may be made of, for example, a porous metal sheet.

As an alternative arrangement, the second pair of electrodes may be disposed upstream from the object to be treated along the flow path of the gas and parallel to the treatment surface of the object to be treated. With this arrangement, each of the second pair of electrodes should have holes formed therethrough for allowing the gas to flow therethrough.

Of the second pair of electrodes disposed upstream from the object to be treated, it is preferable for the electrode closer to the object to be treated to be grounded. Thus, charged particles such as electrons and ions in the plasma can be captured by the grounded electrode, and only neutral activated gas species are directed toward the object to be treated. This prevents charging and damage to the object to be treated caused by exposure to ions. As an alternative arrangement, the opposing surfaces of the second pair of electrodes disposed upstream from the object to be treated may be orthogonal to the object to be treated. In this case there is no necessity for the second pair of electrodes to be provided with holes therethrough for the gas to pass since the gas passes directly between the two electrodes of the second pair.

The first and second plasma generation unit may also comprise three electrodes all together. In this case, the treatment chamber has provided therein a mounting electrode on which the object to be treated is mounted, an opposite electrode disposed upstream from the object to be treated along the flow path of the gas and parallel to the treatment surface of the object to be treated, and a middle electrode disposed between the mounting and opposite electrodes and parallel to the object to be treated. In this configuration, the opposite and middle electrodes form the first plasma generation unit, and the mounting and middle electrodes form the second plasma generation unit.

In this case, the middle electrode, i.e., the one in between the mounting electrode and the opposite electrode, may be grounded, the opposite electrode connected to a first alternating power supply, and the mounting electrode connected to a second alternating power supply. Alternatively, the middle electrode may be connected to an alternating power supply, and the mounting and opposite electrodes grounded, however in this case the power and frequency of both plasma generation units will necessarily be the same.

A preexcitation unit for raising the excitation level of the gas capable of discharge may also be included further upstream from the most upstream plasma generation unit along the flow path of the gas in the gas supply. Thus, the preexcitation unit makes it easier to generate a plasma in the most upstream plasma unit, and the excitation level of the gas in the plasma can be further increased. Furthermore, even with a low gas flow rate, a plasma can be reliably generated in the most upstream plasma unit. The preexcitation unit may be, for example, one which exposes the gas to ultraviolet radiation, or to microwave radiation.

Yet another aspect of the present invention provided includes a plasma treatment apparatus for treating an object to be treated having a treatment chamber in which the object to be treated is disposed. A gas supply in fluid communication with the treatment chamber supplies a gas capable of a plasma discharge to the treatment chamber. A preexcitation unit for raising the excitation level of the gas is disposed upstream along the flow path of the gas in the gas supply. A plasma generation unit for exciting the gas to generate a plasma is also provided along the flow path of the gas downstream from the preexcitation unit relative to the gas flow direction, where the energy of the gas whose excitation level has been raised by the preexcitation unit is maintained, and where the plasma generation unit activates the gas to form activated gas species within the gas. Then, the activated gas species activated by the plasma generation unit treat the object to be treated.

Still another aspect of the present invention provides a method of plasma treating an object to be treated including supplying a gas capable of plasma discharge in a treatment chamber, with an object to be treated disposed therein, through a gas supply. The gas is preexcited upstream along the flow path of the gas in the gas supply, and then the gas is excited so as to generate a plasma along the flow path of the gas downstream from the position where the preexciting is carried out and where the energy of the gas whose excitation level has been raised by the preexciting is maintained. Then, the object to be treated is treated by exposure to activated gas species formed by the plasma.

According to the plasma treatment apparatus and method of the present invention, before the energy of the gas whose excitation level has been raised by preexciting is lost, the gas can be readily excited to generate a plasma in a down stream plasma generation unit, and thus the yield of the treatment on the object to be treated can be improved.

Moreover, since the uniformity of the plasma density in the downstream plasma generation unit is improved, the uniform treatment over the surface of the object to be treated is also improved. Since the density and excitation levels of the activated gas species in the downstream plasma are increased, the treatment rate is also increased.

The above-described plasma treatment apparatus and method of the present invention are preferably applied to a conventional atmospheric pressure plasma treatment apparatus and method for which the uniform treating and stability of the plasma have not been satisfactorily obtained so far.

Another object of the present invention is to provide a plasma treatment apparatus and method which is able to improve the uniform treatment of the object to be treated by improving the uniformity of the plasma density.

A further object of the present invention is to provide a plasma treatment apparatus and method which is able to improve the ashing rate or etching rate by increasing the plasma density and uniformity.

Another object of the present invention is to provide a plasma treatment apparatus and method which is able to improve the yield of the treatment by reducing the damage suffered by the object to be treated while subjected to the plasma.

Still other objects and advantages of the invention will in part be obvious and will in part be apparent from the specification.

The invention accordingly comprises the several steps and the relation of one or more of such steps with respect to each of the others, and the apparatus embodying features of construction, combinations of elements and arrangements of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accompanying drawings, wherein like numbers represent like parts, in which.

PREFERRED EMBODIMENTS OF THE INVENTION

Figure 1:
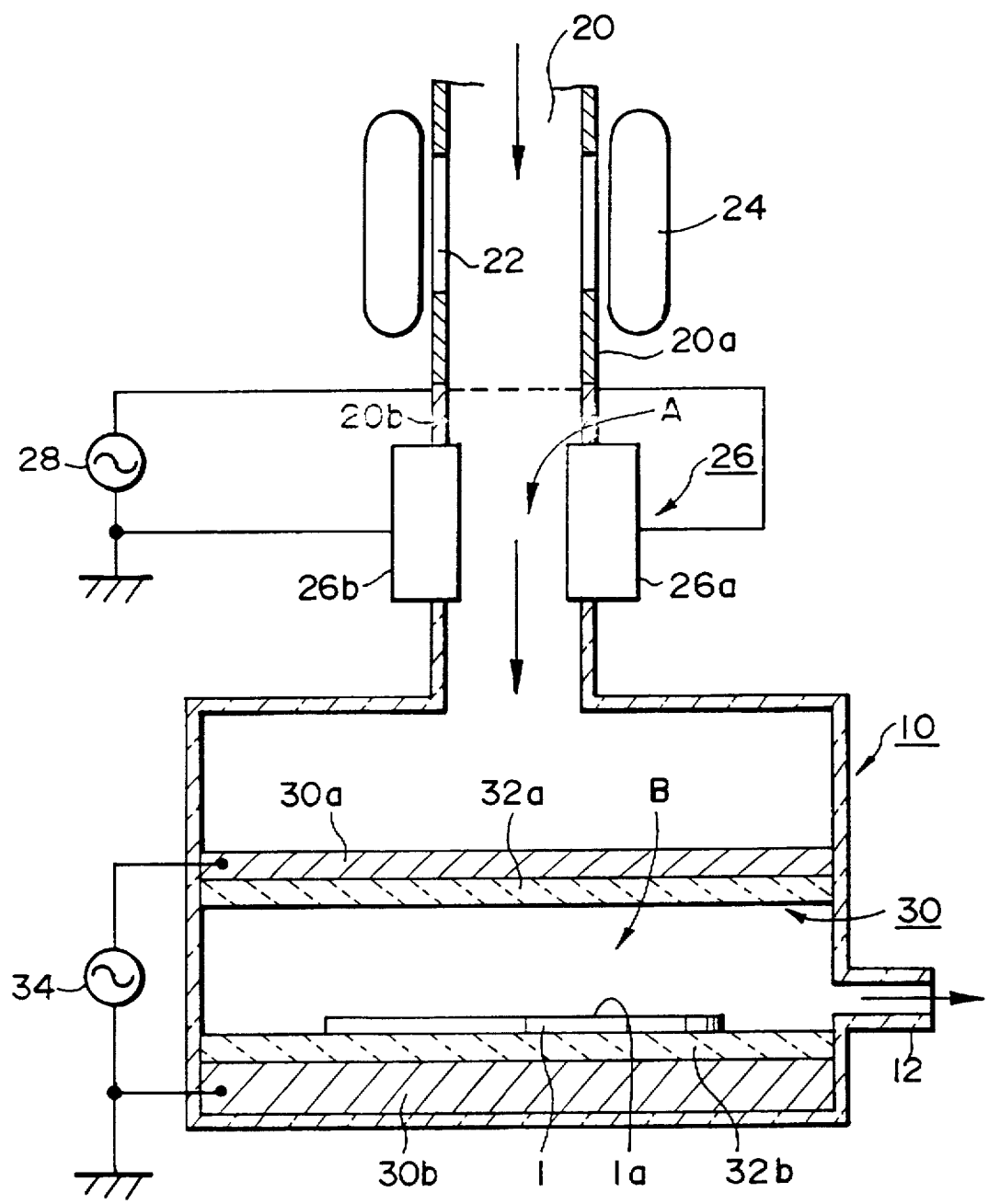
FIG. 1 is a schematic elevational sectional view of a plasma apparatus constructed in accordance with a first embodiment of a treatment the present invention.

A first embodiment of the present invention is described with reference to FIG. 1. FIG. 1 is a sectional elevational view of an atmospheric treatment device has a treatment chamber 10 in which is disposed an object to be treated, for example a semiconductor wafer 1, and a gas supply 20 in fluid communication with treatment chamber 10 and supplying a gas capable of plasma discharge toward semiconductor wafer 1. In this embodiment, gas supply 20 is in fluid communication with the upper wall of treatment chamber 10.

In the wall of first gas supply pipe 20a of gas supply 20 is formed a transparent window 22. An ultraviolet lamp 24 is disposed therearound window 22 and functions as a preexcitation unit. Below transparent window 22 is disposed a first pair of plasma generation electrodes 26 disposed opposing each other on the peripheral wall of gas supply 20. A first electrode 26a of first pair of plasma generation electrodes 26 is connected to a first high-frequency power source 28, and the second electrode 26b is grounded.

First gas supply pipe 20a, in which is formed transparent window 22, can be formed of metal or the like. Gas supply 20 also includes a second gas supply pipe 20b downstream of first gas supply pipe 20a, which has disposed therein first pair of plasma generation electrodes 26, and which is formed of an insulating material such as quartz.

Treatment chamber 10 is in fluid communication with gas supply 20 and generally has a larger cross-sectional area than gas supply 20. Treatment chamber 10 is formed of, for example, quartz, and is in fluid communication with an exhaust pipe 12 in a side wall thereof.

In the interior of treatment chamber 10 is disposed a second pair of plasma generation electrodes 30. Second pair of plasma generation electrodes 30 comprises an upper electrode 30a and a lower electrode 30b. Lower electrode 30b thus functions as a mounting electrode for mounting semiconductor wafer 1 with its upper treatment surface 1a facing upstream, relative to the direction of the flow of gas along gas supply 20.

In order to allow the passage of a gas, upper electrode 30a is formed of, for example, a porous metal. Upper electrode 30a has a dielectric member 32a of a porous material such as a ceramic, on its lower surface. Similarly, lower electrode 30b has a dielectric member 32b of a porous material such as a ceramic on the upper surface. Dielectric members 32a and 32b are provided to prevent an abnormal discharge between electrodes 30a and 30b. Upper electrode 30a is connected to a second high-frequency power supply 34, and lower electrode 30b is grounded.

The description now turns to the operation of the atmospheric pressure plasma treatment apparatus. First, an inert gas such as helium or argon is introduced through gas supply 20 to replace the air in treatment chamber 10. At this stage, treatment chamber 10 is at or about atmospheric pressure. Thereafter, ultraviolet lamp 24, first high-frequency power source 28, and second high-frequency power source 34 are activated simultaneously or sequentially from top to bottom.

Ultraviolet lamp 24 provided in an upstream position of the gas supply path exposes the helium or other inert gas to ultraviolet radiation through transparent window 22. In this way, the energy of the ultraviolet radiation causes photoionization, and excites the gas. At this stage, however, no plasma is observed in the inert gas.

The inert gas, with a raised excitation level, is activated in a plasma region A between first pair of plasma generation electrodes 26, and a plasma is thus generated. In the case of helium gas, this plasma is observed as a faint blue discharge, which is determined to be a glow discharge.

Next, in treatment chamber 10, the activated helium gas is supplied through porous upper electrode 30a and dielectric member 32a to treatment surface 1a of semiconductor wafer 1 supported by lower electrode 30b and dielectric member 32b.

In a plasma region B between second pair of plasma generation electrodes 30, the activated helium gas is further activated, generating a plasma at or about atmospheric pressure. Again in the case of helium gas, this plasma is observed as a faint blue discharge, which is determined to be a glow discharge.

In this way, the plasma state is maintained in plasma regions A and B, and then a treatment gas is added to the helium gas supplied through gas supply 20. After the treatment gas is added, treatment chamber 10 is maintained at or about atmospheric pressure. If it is desired that organic substances adhering to treatment surface 1a of semiconductor wafer 1 are to be removed by ashing, the treatment gas may be molecular oxygen ($O_2$). Adding oxygen changes the discharge in plasma regions A and B to a white color.

Thus, activated gas species such as oxygen ions and oxygen radicals present in plasma region B react with organic substances adhering to treatment surface 1a. In this reaction the organic substances are broken up into carbon monoxide, carbon dioxide and water vapor, and expelled through exhaust pipe 12.

Various other substances may be used as the treatment gas, and if, for example, the desire is to remove a silicon oxide film formed on treatment surface 1a by etching, carbon tetrafluoride ($CF_4$) may be used. Thus a variety of treatment gases may be used for various treatments such as etching and ashing.

In the first embodiment, since the gas is first exposed to ultraviolet radiation in an upstream portion of the gas supply path, the excitation level of the gas is raised. As a result it is easier to generate a plasma in the downstream plasma region A, and a more stable plasma can be created in plasma region A. Since the activated gas in plasma region A is activated again in downstream plasma region B, the generation of a plasma in plasma region B is also stable, and the yield of the treatment of semiconductor wafer 1 can be improved. Furthermore, in plasma region B, the density and excitation levels of activated gas species such as helium radicals and oxygen radicals can be increased. Therefore, the uniformity of treatment over surface 1a of semiconductor wafer 1 can be improved, and the treatment rate can be increased.

It is thus necessary to position downstream plasma region B so as to maintain the activated state of the gas activated in plasma region A. The lifetime of the activated gas species created in plasma region A depends on the voltage and frequency applied to create the plasma in plasma region A. Therefore, the distance between plasma regions A and B should be set appropriately to meet the creation conditions of the plasma in plasma region A.

Next, the conditions for generating a plasma in plasma regions A and B are considered. First and second high-frequency power sources 28 and 34, respectively, may be the same power source, for example, a 13.56 MHZ power supply. Alternatively, first and second high-frequency power sources 28 and 34 may have different voltage, power, or frequency settings.

Preferably, the frequency of first high-frequency power source 28 is set to be lower than the frequency of second high-frequency power source 34. When the frequency of the high-frequency power for creating upstream plasma region A is reduced, the peak-to-peak voltage of this high-frequency power increases, and allows the gas to be adequately activated in plasma region A. On the other hand, when the frequency of the high-frequency power for generating a plasma in downstream plasma region B is increased, charging of semiconductor wafer 1 is prevented, and plasma damage can be reduced. If the frequencies are set according to this relationship, sufficient energy can be imparted to the gas for activation in upstream plasma region A. Furthermore, in downstream plasma region B, in the vicinity of semiconductor wafer 1, it is possible to increase the density of activated gas species and their excitation levels using the gas activated upstream, while imparting a small amount of energy. It is thus preferable to set the frequency of second high-frequency power source 34 above about 13.56 MHZ, and to set the frequency of first high-frequency power source 28 in the range of about 400 kHz to about 13.56 MHZ.

Next, the power of first and second high-frequency power sources 28 and 34 is considered. It is preferable for the power of first high-frequency power source 28 to be higher than the power of second high-frequency power source 34. These power settings enable an adequate energy to be imparted to the gas in upstream plasma region A, and the gas to be adequately activated in the upstream plasma region A. On the other hand, in plasma region B in the vicinity of semiconductor wafer 1, using the gas activated upstream while imparting a low power, it is still possible to increase the density of activated gas species and their excitation levels, allowing more efficient treatment without causing wafer damage.

As shown in FIG. 1, the cross-sectional area of gas supply 20 forming plasma region A can be made sufficiently small compared with the cross-sectional area of the treatment chamber 10. The gap between first pair of plasma generation electrodes 26 can be made short, so that, as far as these factors are concerned, adequate energy can be supplied to the gas in plasma region A.

Next, a second embodiment of the present invention is described with reference to FIG. 2. The difference between this second embodiment and the first embodiment is that ultraviolet lamp 24 in FIG. 1, which is a preexcitation unit, is replaced with a magnetron 40 which radiates microwave radiation through the gas capable of plasma discharge. Magnetron 40 is installed at the top of gas supply 20, and is constructed to emit microwaves along the flow path of gas supply 20. Magnetron 40 emits, for example, 2.45 GHz microwaves along the direction of supply of the gas and thermally raises the excitation level of the gas. In this second embodiment, by using microwaves for the preexcitation compared with ultraviolet lamp 24 of FIG. 1, the excitation level of the gas can be made even higher. Except for this different method of preexcitation, the second embodiment provides the same effect as the first embodiment.

It should be noted that the microwave radiation emitted by magnetron 40 does not necessarily have to be irradiated along the flow path of the gas supply. However, since microwaves are easily reflected, It is preferable and easy to direct the radiation along the flow direction of gas supply 20.

Next, a third embodiment of the present invention is described with reference to FIG. 3. The difference between this third embodiment and the second embodiment is that second pair of plasma generation electrodes 30 in FIG. 2 are replaced with a second pair of plasma generation electrodes 50 disposed as shown in FIG. 3. Second pair of plasma generation electrodes 50 are positioned upstream of semiconductor wafer 1 along the flow path of the gas, and the two electrodes making up the pair are disposed facing each other on opposite side walls of treatment chamber 10. The individual electrodes 50a and 50b of second pair of plasma generation electrodes 50 have their electrode surfaces orthogonal to treatment surface 1a of semiconductor wafer 1. In this configuration, the gap between the electrodes 50a and 50b is relatively large, but it is not necessary to provide gas-porous holes on each of electrodes 50a and 50b, and the gas from gas supply 20 can be introduced directly toward treatment surface 1a.

This device of the third embodiment is further provided with an ultraviolet lamp 60 which emits light, for example ultraviolet light, toward plasma region B. In the configuration shown in FIGS. 1 and 2 it is difficult to emit light toward plasma region A because of the presence of upper electrode 30a and dielectric member 32a, but in the configuration shown in FIG. 3 ultraviolet radiation can be radiated easily from the top of treatment chamber 10. By means of this ultraviolet radiation, the excitation level of the gas in its activated state introduced into plasma region B can be made still higher. Furthermore, it is possible to increase the density of activated gas species and their excitation levels in plasma region B. Moreover, by irradiating ultraviolet radiation toward the plasma region B from ultraviolet lamp 60, it is also possible to make the startup generation of the plasma in plasma region B easier.

Figure 4:
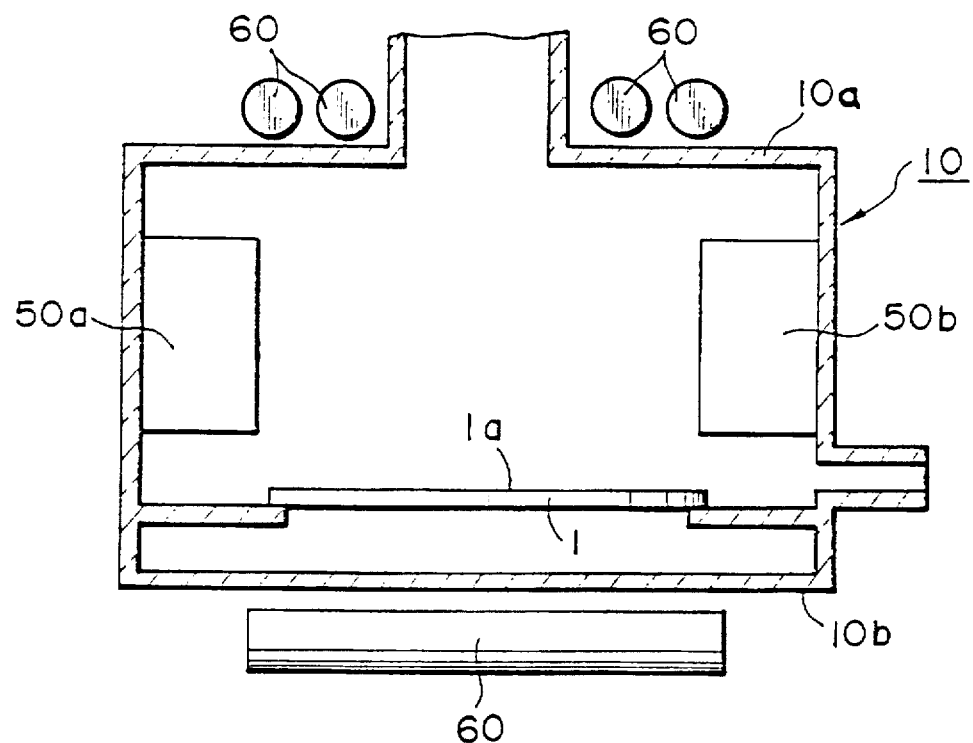
FIG. 4 is a partial schematic elevational sectional view of a modification of the ultraviolet lamp position from that shown in FIG. 3.

As shown in FIG. 4, it is also possible to dispose ultraviolet lamp 60 above treatment chamber 10, and to provide ultraviolet lamps 60 in positions facing an upper wall 10a and lower wall 10b, each wall made transparent and formed of, for example, quartz. In this case, disposing upper and lower ultraviolet lamps 60 with their axes orthogonal to each other, as shown in FIG. 4, provides a uniform irradiation of ultraviolet radiation toward an object to be treated 1.

Figure 2:
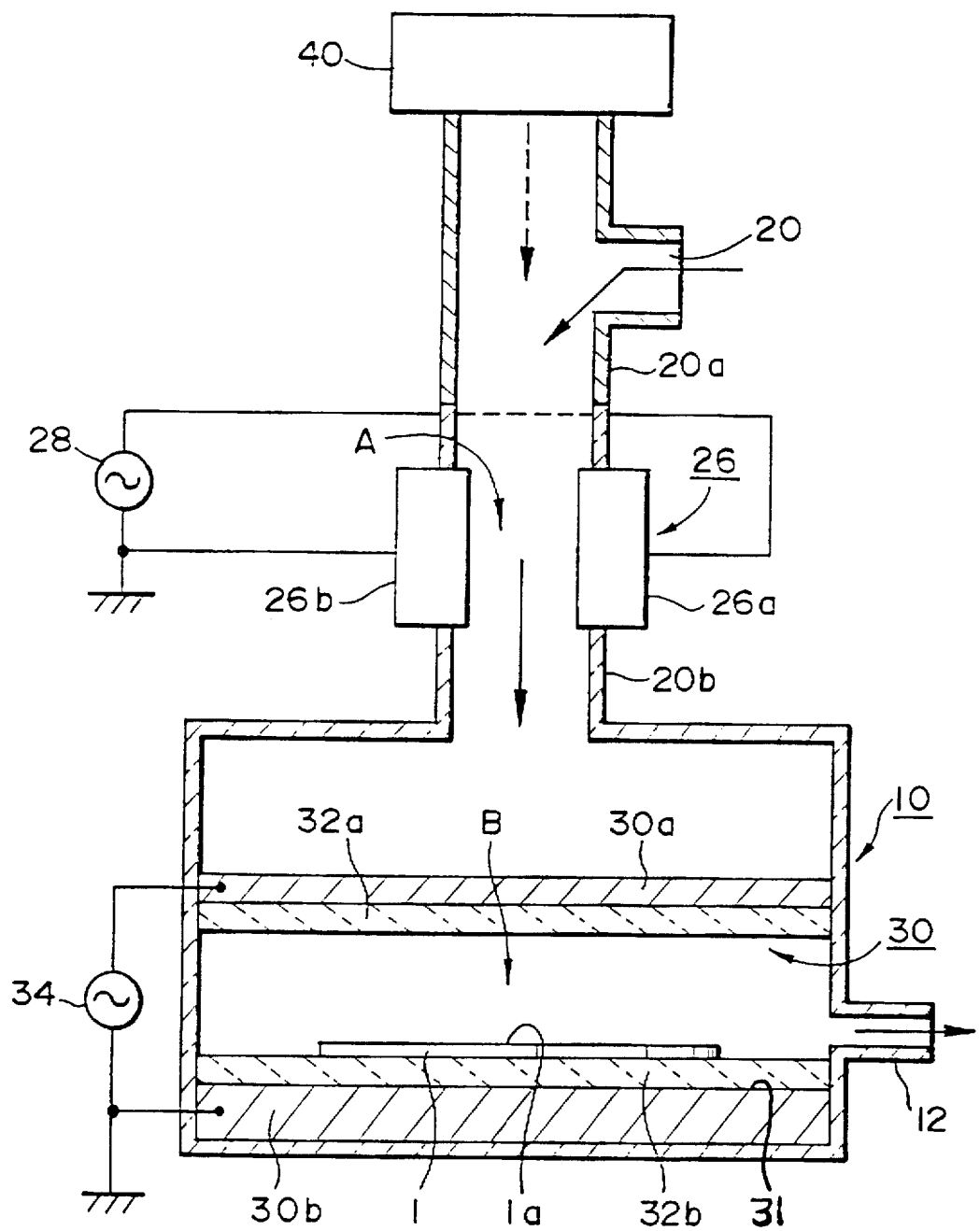
FIG. 2 is a schematic elevational sectional view of a plasma treatment apparatus constructed in accordance with a second embodiment of the present invention.
Figure 3:
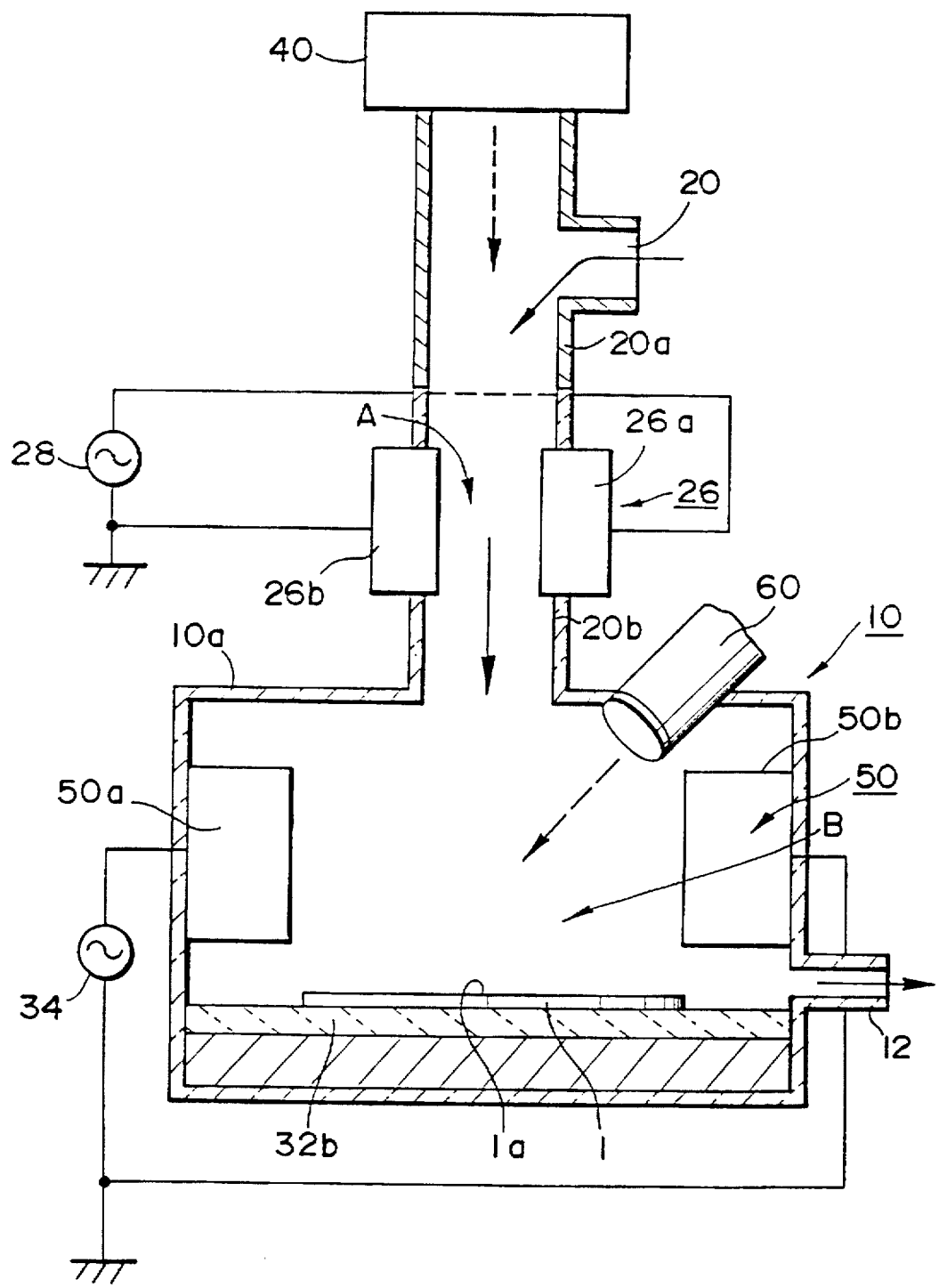
FIG. 3 is a schematic elevational sectional view of a plasma treatment apparatus constructed in accordance with a third embodiment of the present invention.
Figure 5:
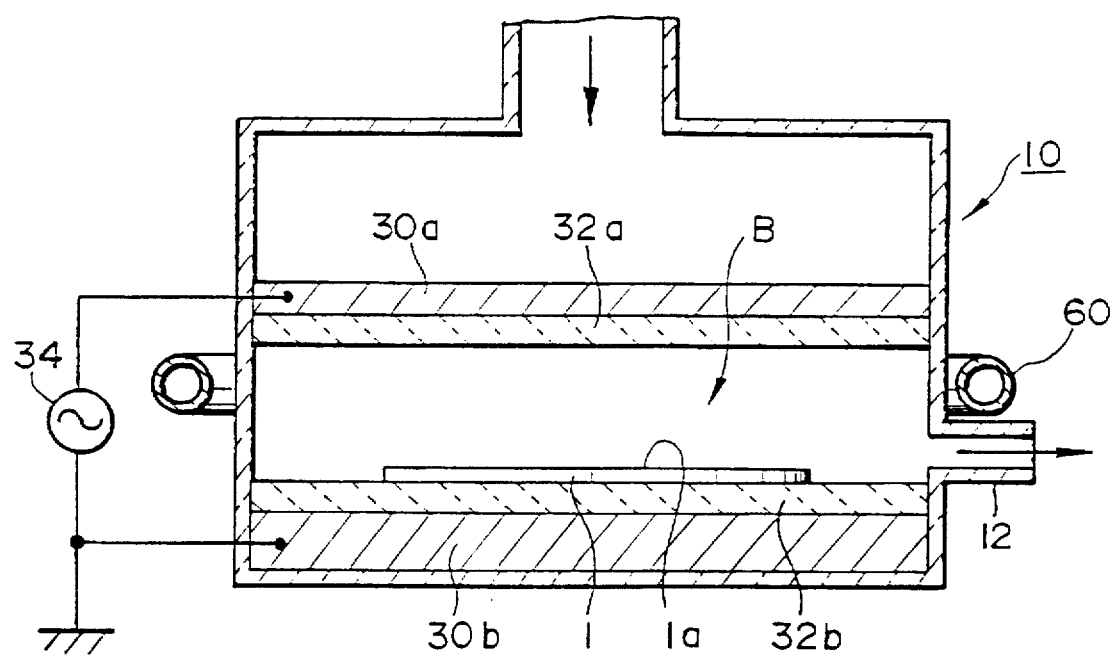
FIG. 5 is a partial schematic elevational sectional view of a modification of the plasma treatment apparatus from those shown in FIGS. 1 and 2 by including an ultraviolet lamp.

Alternatively, in a configuration of second pair of plasma generation electrodes 30 as shown in FIGS. 1 and 2, a ring-shaped ultraviolet lamp 60 can be arranged around treatment chamber 10 on the exterior of side wall 10b made transparent, and formed of, for example, quartz, as shown in FIG. 5.

Next, a fourth embodiment of the present invention is described with reference to FIG. 6. The treatment apparatus has a first pair of plasma generation electrodes 70 disposed not in gas supply 20, but directly within treatment chamber 10. Each of the upper electrode 70a and lower electrode 70b of first pair of plasma generation electrodes 70 is formed of a porous metal in order to allow the gas capable of discharge to pass therethrough. Upper electrode 70a has a dielectric member 72a on the surface which faces the surface of lower electrode 70b, while lower electrode 70b has a dielectric member 72 on the surface thereof. Dielectric members 72a and 72b are provided to prevent an abnormal discharge between electrodes 70a and 70b. Dielectric members 72a and 72b are also formed of a porous material, such as a ceramic, in order to allow the gas to pass therethrough.

In this case, if the distance L1 between grounded lower electrode 70b and upper electrode 70a connected to second high-frequency power source 34 is larger than the other inter-electrode distances, L2 and L3, respectively, then a plasma can be generated in plasma regions A and B.

Again, the abovementioned inter-electrode distance L1 can be made smaller than distance L3 between upper electrode 30a and lower electrode 30b forming second pair of plasma generation electrodes 30. In this case, it is difficult to generate a plasma in plasma region B, and therefore a plasma is generated between lower electrode 70b and upper electrode 30a. In this way, since semiconductor wafer 1 is not directly exposed to the plasma, there is the unexpected beneficial effect that plasma damage is thereby reduced.

Figure 7:
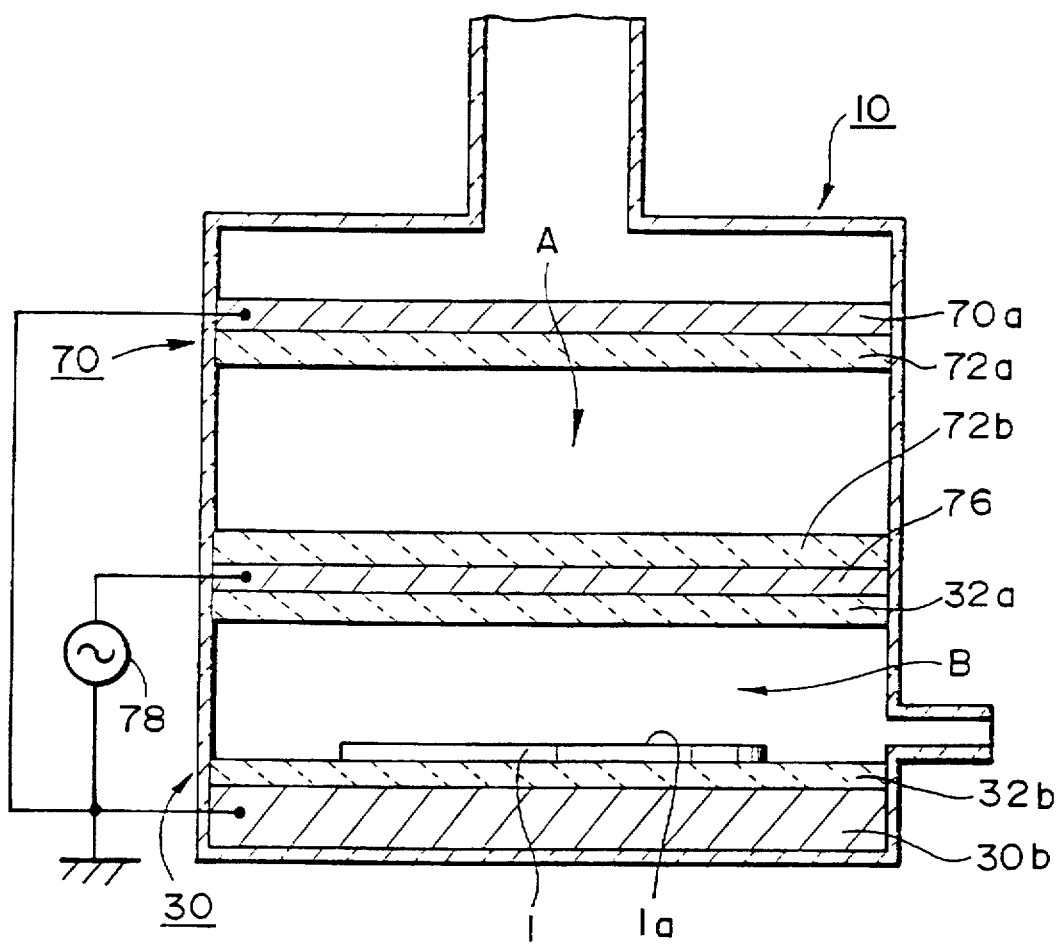
FIG. 7 is a schematic elevational sectional view of a modification of a plasma treatment apparatus using an intermediate electrode to replace the two electrodes in the embodiment shown in FIG. 6.
Figure 8:
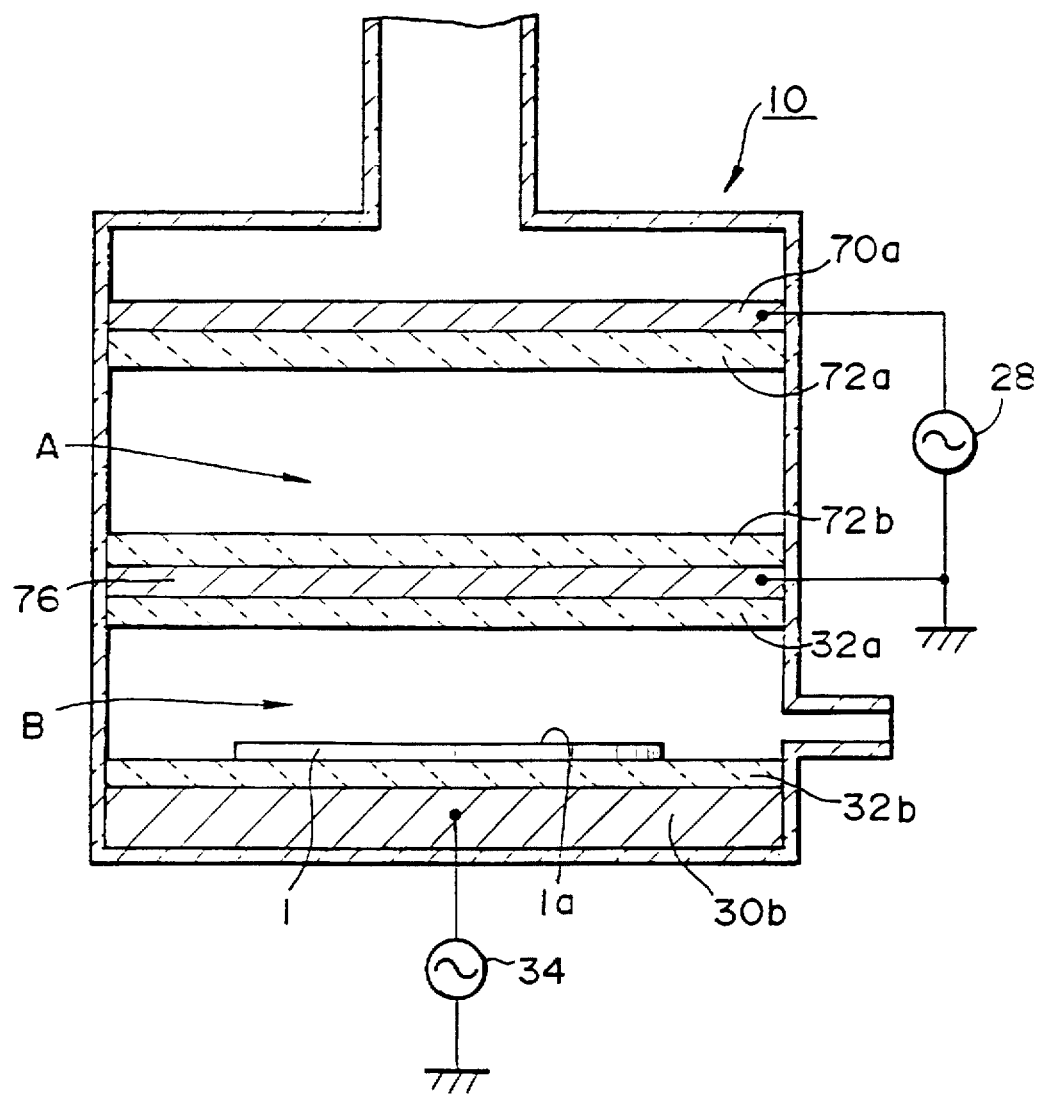
FIG. 8 is a schematic elevational sectional view of yet another modification of a plasma treatment apparatus using an intermediate electrode to replace the two electrodes in the embodiment shown in FIG. 6.

First and second pairs of plasma generation electrodes 25, 30 and 70 may also be configured as shown in FIGS. 7 and 8. In these figures, the two electrodes 30a and 70b, respectively, are substituted by a single middle electrode 76. Dielectric members 32a and 72b are formed on opposite surfaces of middle electrode 76. In this configuration, first pair of plasma generation electrodes 70 is formed by upper electrode 70a and middle electrode 76. On the other hand, second pair of plasma generation electrodes 30 is formed by lower electrode 30b and middle electrode 76.

In FIG. 7, a common high-frequency power source 78 is connected to middle electrode 76, and upper electrode 70a and lower electrode 30b are grounded. In FIG. 8, middle electrode 76 is grounded, and first high-frequency power source 28 is connected to upper electrode 70a, and second high-frequency power source 34 is connected to lower electrode 30b.

In the embodiments shown in FIGS. 7 and 8, plasma regions A and B are generated in the same way as in the first to third embodiments, and the same effect as in the first to third embodiments may be obtained. In particular, in FIG. 7, power source 78 is used to generate the upstream and downstream plasma regions A and B, respectively. Moreover, since lower electrode 30b, which also functions as a mounting electrode, can be grounded, the plasma treatment mode is the same as in FIGS. 1 to 6. On the other hand, the use of common power source 78 means that the frequency, power, voltage and other conditions for generating the plasma in upstream and downstream plasma regions A and B, respectively, are the same. Nonetheless, for example, making the gap between intermediate electrode 76 and upper electrode 70a narrower than the gap between intermediate electrode 76 and lower electrode 30b, it is possible to obtain different plasma generation conditions in plasma regions A and B.

In FIG. 8, however, since lower electrode 30b which functions as a mounting electrode is not grounded, the plasma treatment mode is different from that in FIGS. 1 to 6. On the other hand, the use of independent power sources 28 and 34, respectively, means that the frequency, power, voltage and other conditions for generating the plasma in upstream and downstream plasma regions A and B, respectively, can be made different, as in FIGS. 1 to 6.

Figure 9:
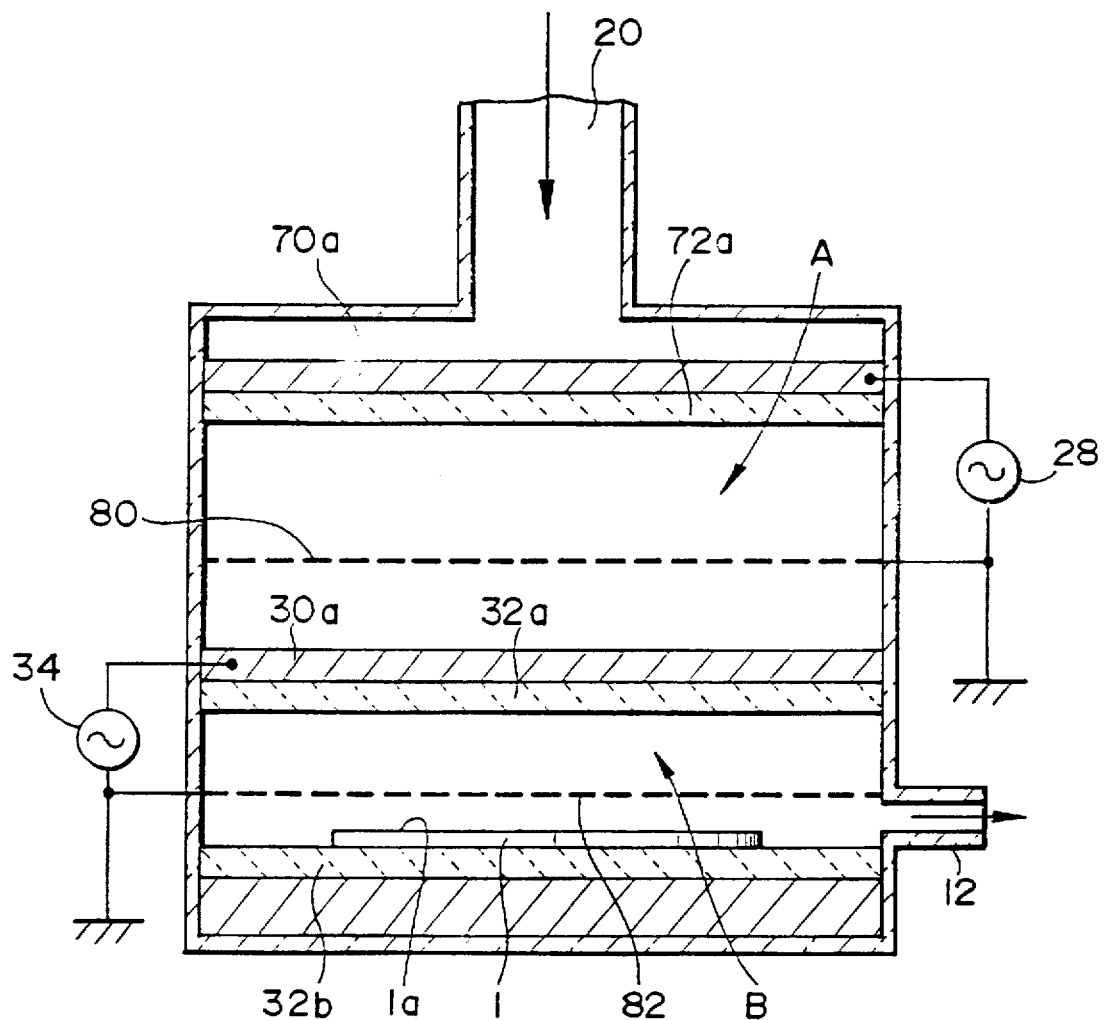
FIG. 9 is a schematic elevational sectional view of a plasma treatment apparatus constructed in accordance with a fifth embodiment of the present invention.

Next, a fifth embodiment of the present invention is described with reference to FIG. 9. The differences of this fifth embodiment from the fourth embodiment, shown in FIG. 6, are as follows. Firstly, lower electrode 70b of first pair of plasma generation electrodes 70 shown in FIG. 6 is replaced with a first ion capture electrode 80 shown in FIG. 9. First ion capture electrode 80 is formed from a wire grid or perforated metal sheet, and is connected to ground potential so as to capture charged particles such as ions and electrons.

Figure 6:
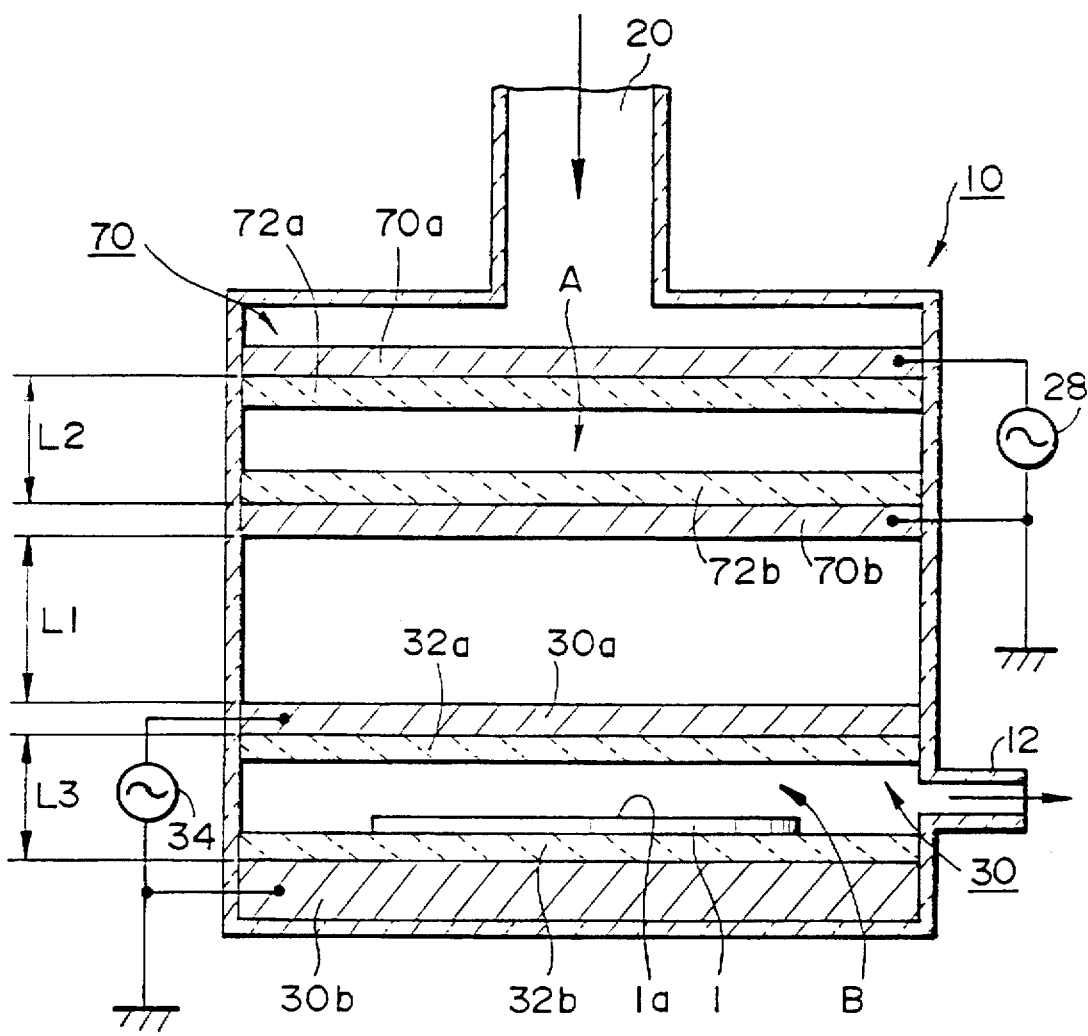
FIG. 6 is a schematic elevational sectional view of a plasma treatment apparatus constructed in accordance with a fourth embodiment of the present invention.

Similarly, lower electrode 30b of second pair of plasma generation electrodes 30 shown in FIG. 6 is replaced with a second ion capture electrode 82 disposed upstream of semiconductor wafer 1 along the flow path of the gas in the gas supply. Second ion capture electrode 82 has a similar formation to first ion capture electrode 80, and is again connected to ground potential and serves to capture ions. Second ion capture electrode 82 further captures ions, thereby protecting semiconductor wafer 1 from electrostatic charge and damage.

In the case where there is only a single set of plasma generation electrodes, providing an ion capture electrode of this type reduces the reaction speed. Nevertheless in this embodiment, the provision of the two-stage plasma regions A and B increases the density of neutral activated gas species and their excitation levels in downstream plasma region B, and holds the reduction in the reaction speed to a minimum.

The present invention is not limited to the embodiments described above, and a range of various embodiments will be possible within the scope of the present invention. In the embodiments described above, two-stage plasma regions A and B are provided, so as to increase the density of activated gas species and their excitation levels in plasma region B. It is equally possible to provide three or more plasma regions. In this case the reaction speed can be yet further increased. Again, in the above described embodiments, parallel flat plate electrodes are used as the plasma 20 generation units. Nevertheless, the form of the first upstream plasma generation electrodes is not limited to such parallel flat plate electrodes, and other devices, such as, for example, microwaves may also be used to generate the plasma.

Furthermore, the present invention is not restricted to a plasma treatment apparatus operating at atmospheric pressure, but may also be applied similarly to a vacuum plasma treatment apparatus. In the case of a vacuum plasma treatment apparatus, treatment chamber 10 may be made as a pressure-resistant container, and exhaust pipe 12 connected to a vacuum pump.

The plasma treatment to which the present invention is applied is also not limited to ashing or etching, but may be applied to any treatments using a plasma.

It will thus be seen that the objects set forth above, among those made apparent from the preceding description, are efficiently attained and, since certain changes may be made in carrying out the above method and in the constructions set forth without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described and all statements of the scope of the invention which, as a matter of language, might be said to fall therebetween.

What is claimed is:

1. A plasma treatment apparatus for treating a surface of an object to be treated, comprising:

a treatment chamber in which an object to be treated is disposed;

a gas supply in fluid communication with said treatment chamber and supplying a gas capable of plasma discharge along a flow path to said treatment chamber; and at least two plasma generation units for exciting said gas to generate a plasma at or above atmospheric pressure, said plasma generation units being disposed at different positions along said flow path, said different positions including an upstream position and a downstream position in the direction of the flow path of said gas, said upstream position being downstream of said gas supply;

said upstream plasma generation unit at said upstream position preactivating said gas, said downstream plasma generation unit at said downstream position activating said preactivated gas to generate activated gas species, and said activated gas species treating said object.

2. A plasma treatment apparatus for treating a surface of an object to be treated, comprising:

a treatment chamber in which an object to be treated is disposed;

a gas supply in fluid communication with said treatment chamber and supplying a gas capable of plasma discharge along a flow path to said treatment chamber;

a first plasma generation unit for generating a plasma at or above atmospheric pressure, said first plasma generation unit disposed upstream of said object and downstream of said gas supply in the direction of the flow path of said gas; and a second plasma generation unit for generating a plasma at or above atmospheric pressure and activating said gas to form activated gas species, said second plasma generation unit being disposed downstream from said first plasma generation unit in the flow path of said gas;

wherein said activated gas species treat said object.

3. The plasma treatment apparatus according to claim 2, wherein said second plasma generation unit reexcites said gas from said first plasma generating unit to maintain the activated state of said gas activated by said first plasma generation unit.

4. The plasma treatment apparatus according to claim 2, wherein said first plasma generation unit further comprises:

a first pair of plasma generating electrodes; and a first power source for supplying alternating current to said first pair of electrodes;

and wherein said second plasma generation unit further comprises:

a second pair of plasma generating electrodes; and a second power source for supplying alternating current to said second pair of electrodes.

5. The plasma treatment apparatus according to claim 4, wherein the frequency of said alternating current of said first power source is lower than the frequency of said alternating current of said second power source.

6. The plasma treatment apparatus according to claim 5, wherein the frequency of said alternating current of said second power source is about 13.56 MHZ or greater.

7. The plasma treatment apparatus according to claim 5, wherein the frequency of said alternating current of said first power source is in the range of about 400 kHz to about 13.56 MHZ.

8. The plasma treatment apparatus according to claim 4, wherein said first power source supplies a higher voltage than said second power source.

9. The plasma treatment apparatus according to claim 4, wherein said gas supply includes a gas flow path with a cross-sectional area smaller than the cross-sectional area of said treatment chamber, said first pair of electrodes facing each other with said gas flow path therebetween.

10. The plasma treatment apparatus according to claim 4, wherein said first pair of electrodes are disposed within said treatment chamber facing each other.

11. The plasma treatment apparatus according to claim 10, wherein said first pair of electrodes is disposed substantially parallel to the surface of said object to be treated, and each electrode of said first pair of electrodes has holes formed therethrough for allowing said gas to flow.

12. The plasma treatment apparatus according to claim 11, wherein an electrode of said first pair of electrodes closer to said object is grounded, whereby said grounded electrode may capture charged particles, such as ions, in said activated gas.

13. The plasma treatment apparatus according to claim 4, wherein said second pair of electrodes comprises a mounting electrode on which said object to be treated is supported, and an opposite electrode opposite said mounting electrode; and said opposite electrode having holes formed therethrough for allowing said gas to flow.

14. The plasma treatment apparatus according to claim 4, wherein said second pair of electrodes is disposed upstream from said object relative to the flow path of said gas and substantially parallel to the surface of said object to be treated, and each of said second pair of electrodes having holes formed therethrough for allowing said gas to flow.

15. The plasma treatment apparatus according to claim 14, wherein an electrode of said second pair of electrodes disposed closer to said object is grounded, and said grounded electrode captures charged particles such as ions in said activated gas species.

16. The plasma treatment apparatus according to claim 4, wherein said second pair of electrodes is disposed upstream from said object relative to the flow path of said gas and substantially orthogonal to the surface of said object to be treated.

17. The plasma treatment apparatus according to claim 2, wherein said first and second plasma generation units are mounted in said treatment chamber and comprises:

a mounting electrode on which said object is supported;

an opposite electrode disposed parallel to and upstream from said mounting electrode relative to the flow of said gas; and a middle electrode disposed parallel to and between said mounting electrode and said opposite electrode;

wherein said first plasma generation unit includes said opposite electrode and said middle electrode and said second plasma generation unit includes said middle electrode and said mounting electrode.

18. The plasma treatment apparatus according to claim 17, wherein said middle electrode is grounded, said opposite electrode is connected to a first power source, and said mounting electrode is connected to a second power source.

19. The plasma treatment apparatus according to claim 17, wherein said middle electrode is connected to a power source, said opposite electrode is grounded and said mounting electrode is grounded.

20. The plasma treatment apparatus according to claim 2, further comprising:

an excitation unit for raising the excitation level of said gas, said excitation unit being disposed opposite said object.

21. The plasma treatment apparatus according to claim 2, further comprising:

an excitation unit for raising the excitation level of said gas, said excitation unit being disposed upstream from said first plasma generation unit relative to the flow path of said gas.

22. The plasma treatment apparatus according to claim 20, wherein said excitation unit excites said gas by exposing said gas to ultraviolet radiation.

23. The plasma treatment apparatus according to claim 17, wherein said excitation unit excites said gas by exposing said gas to microwave radiation.

24. A plasma treatment apparatus for treating an object, comprising:

a treatment chamber in which an object to be treated is disposed;

a gas supply for supplying a gas capable of plasma discharge along a flow path to said treatment chamber;

an excitation unit for exciting said gas, said excitation unit being disposed upstream from said object and downstream of said gas supply in the flow path of said gas; and a plasma generation unit to generate a plasma at or about atmospheric pressure for activating said gas to form activated species, said plasma generation unit being disposed along said gas supply downstream from said excitation unit in the flow path of said gas;

whereby said activated gas species treat said object.

25. The plasma treatment apparatus according to claim 24, wherein said excitation unit excites said gas by exposing said gas to ultraviolet radiation.

26. The plasma treatment apparatus according to claim 24, wherein said excitation unit excites said gas by exposing said gas to microwave radiation.

27. A method of plasma treating a surface of an object, comprising the steps of:

supplying a gas capable of discharge to an object to be treated, said object being disposed in a treatment chamber, said chamber being in fluid communication with a gas supply, along a flow path;

activating said gas by generating a plasma at or about atmospheric pressure at different positions along the flow path of said gas, said positions including an upstream position and a downstream position in said direction of flow of said gas, said upstream position being downstream of said gas supply, said upstream plasma generation position preactivating said gas, and said downstream plasma generation position forming activated gas species from said preactivated gas; and treating said object by exposure to said activated gas species.

28. The method according to claim 27, wherein said activating step further includes preactivating said gas at said upstream plasma generation position by applying a first alternating current power source to a first pair of electrodes disposed at said upstream plasma generation position; and generating said plasma at said downstream plasma generation position by applying a second alternating current power source to a second pair of electrodes disposed at said downstream plasma generation position; and wherein the frequency of said first alternating current power source is lower than said second alternating current power source.

29. The method according to claim 28, wherein the frequency of said second alternating current power source is greater than about 13.56 MHZ.

30. The method according to claim 28, wherein the frequency of said first alternating current power source is in the range of about 400 kHz to about 13.56 MHZ.

31. The method according to claim 28, wherein said first alternating current power source has a voltage larger than the voltage of said second alternating current power source.

32. The method according to claim 27, further comprising the step of preexciting said gas at a position upstream from said upstream plasma generation position relative to the flow path of said gas.

33. The method according to claim 32, wherein said preexciting step includes exposing said gas to ultraviolet radiation.

34. The method according to claim 32, wherein said preexciting step includes exposing said gas to microwave radiation.

35. The method according to claim 27, wherein the gas at said downstream plasma generation position is reexcited to maintain the activated state of the gas activated at said upstream plasma generation position.

36. A method of plasma treating a treatment surface of an object to be treated, comprising:

supplying a gas capable of discharge along a flow path to an object to be treated said object being disposed in a treatment chamber, said chamber being in fluid communication with a gas supply;

preexciting said gas at a position upstream from said chamber in the flow path of said gas;

activating said gas by generating a plasma at or about atmospheric pressure at different positions along the flow path of said gas, said positions including an upstream position and a downstream position in said direction of flow of said gas, said upstream plasma generation position disposed downstream from said preexciting position and preactivating said gas, said upstream position being downstream of said gas supply, and said downstream plasma generation position disposed downstream from said upstream plasma generating position and forming activated gas species from said preactivated gas; and treating said object by said activated gas species.

37. A method of plasma treating a treatment surface of an object, comprising:

supplying a gas capable of discharge along a flow path to an object to be treated;

disposing said object in a treatment chamber, said flow path being provided with a cross-sectional area smaller than the cross-sectional area of said treatment chamber;

preexciting said gas at or above atmospheric pressure at a first position, upstream from said chamber and downstream from said gas supply in the flow path of said gas, by applying a first alternating current power source to a first pair of electrodes disposed at said upstream plasma generation position, said first pair of electrodes facing each other with said gas flow path therebetween;

activating said preexcited gas by generating a plasma at or about atmospheric pressure to form activated gas species at a second position, said second position being downstream from said first position in said direction of flow of said gas, by applying a second alternating current power source to a second pair of electrodes disposed at said downstream plasma generation position; and treating said object by said activated gas species.

* * * * *